US012694941B2

(12) United States Patent (10) Patent No.: US 12,694,941 B2

Nguyen et al. (45) Date of Patent: Jul. 28, 2026

(54) PAGE-LEVEL AND STRIPE-BASED READ ERROR HANDLING

(71) Applicant: Micron Technology, Inc., Boise, ID (US)

(72) Inventors: Phong Sy Nguyen, Livermore, CA (US); James Fitzpatrick, Laguna Niguel, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 18/975,703

(22) Filed: Dec. 10, 2024

(65) Prior Publication Data

US 2025/0226045 A1 Jul. 10, 2025

Related U.S. Application Data

(60) Provisional application No. 63/617,885, filed on Jan. 5, 2024.

(51) Int. Cl.
   *G11C 29/42* (2006.01)
(52) U.S. Cl.
   CPC .................................... *G11C 29/42* (2013.01)
(58) Field of Classification Search
   None
   See application file for complete search history.

(56) References Cited

U.S. PATENT DOCUMENTS

| | | | | |
|---|---|---|---|---|
| 8,996,957 B1 * | 3/2015 | Northcott | .......... | H03M 13/2906 |
| | | | | 714/763 |
| 9,176,812 B1 * | 11/2015 | Northcott | ............ | G06F 11/1044 |
| 9,208,018 B1 * | 12/2015 | Northcott | ............ | G06F 11/1008 |
| 10,372,529 B2 * | 8/2019 | Tai | ........................ | G06F 11/108 |
| 10,587,288 B1 * | 3/2020 | Chilappagari | ...... | G06F 11/1068 |
| 11,042,441 B2 * | 6/2021 | McGlaughlin | ........ | G06F 3/0619 |
| 11,521,701 B2 * | 12/2022 | Cheng | ............... | H03M 13/3707 |
| 11,984,171 B2 | 5/2024 | Fitzpatrick et al. | | |
| 2017/0255518 A1 * | 9/2017 | Achtenberg | ...... | H03M 13/2927 |
| 2018/0091172 A1 * | 3/2018 | Ilani | .................... | G06F 11/1068 |
| 2020/0210286 A1 * | 7/2020 | Kumar | .............. | H03M 13/2906 |
| 2024/0054051 A1 * | 2/2024 | Parashari | ............ | H03M 13/611 |

OTHER PUBLICATIONS

R. Motwani and C. Ong, "Soft decision decoding of RAID stripe for higher endurance of flash memory based solid state drives," 2015 International Conference on Computing, Networking and Communications (ICNC), Garden Grove, CA, USA, 2015, pp. 603-607, (Year: 2015).*

* cited by examiner

*Primary Examiner* — Daniel F. McMahon

(74) *Attorney, Agent, or Firm* — Schwegman Lundberg & Woessner, P.A.

(57) ABSTRACT

Various embodiments provide for page-level and stripe-based read error handling for a memory system, such as a memory sub-system. For various embodiments, the page-level and stripe-based read error handling reduces the overall latency of a read error handling process (e.g., a multi-stage REH process). Additionally, various embodiments reduce the amount of memory space (e.g., buffer space) used during the stripe-based read error handling.

20 Claims, 6 Drawing Sheets

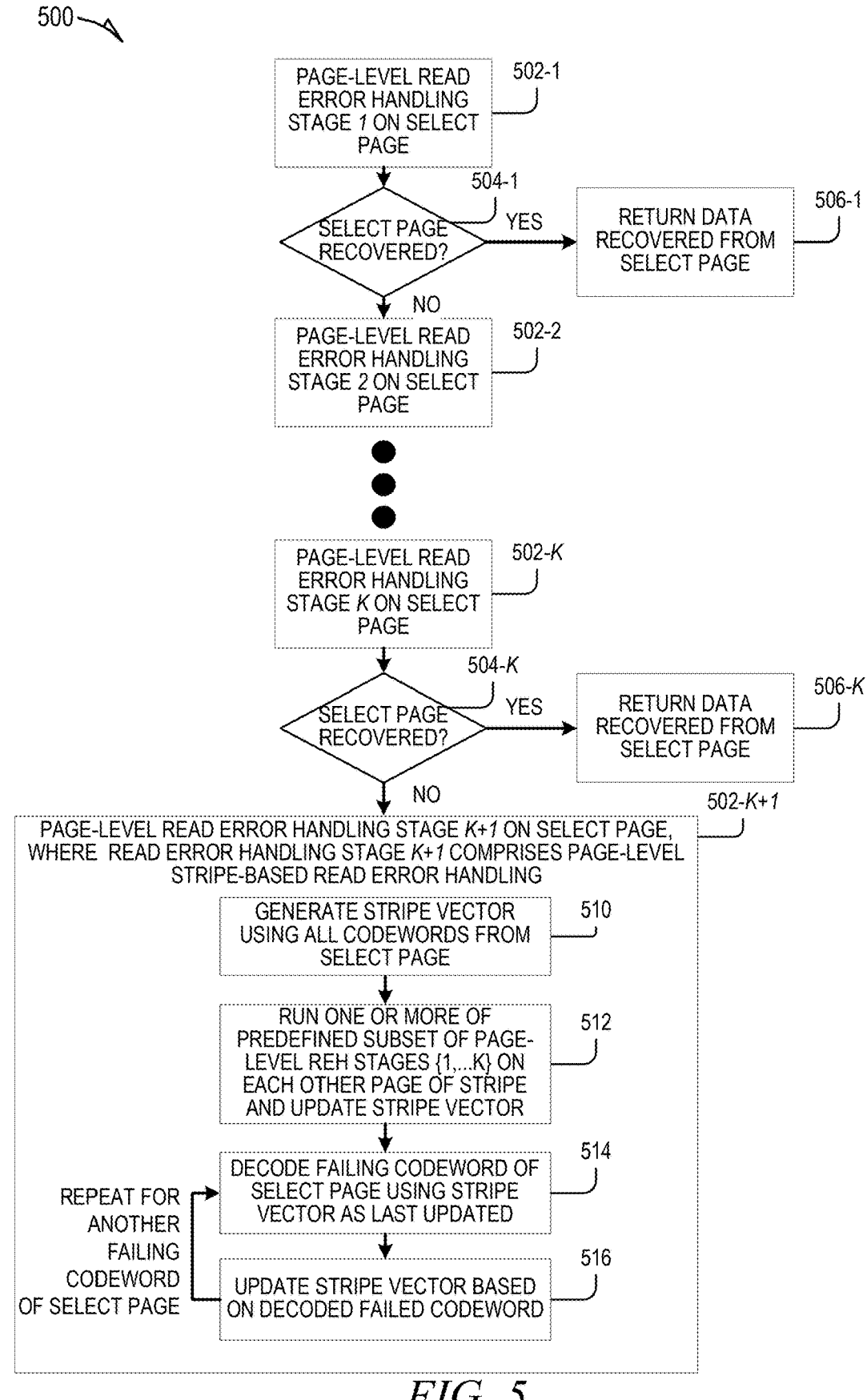

500

PAGE-LEVEL READ ERROR HANDLING STAGE 1 ON SELECT PAGE — 502-1

SELECT PAGE RECOVERED? — 504-1

YES → RETURN DATA RECOVERED FROM SELECT PAGE — 506-1

NO

PAGE-LEVEL READ ERROR HANDLING STAGE 2 ON SELECT PAGE — 502-2

PAGE-LEVEL READ ERROR HANDLING STAGE K ON SELECT PAGE — 502-K

SELECT PAGE RECOVERED? — 504-K

YES → RETURN DATA RECOVERED FROM SELECT PAGE — 506-K

NO

PAGE-LEVEL READ ERROR HANDLING STAGE K+1 ON SELECT PAGE, WHERE READ ERROR HANDLING STAGE K+1 COMPRISES PAGE-LEVEL STRIPE-BASED READ ERROR HANDLING — 502-K+1

GENERATE STRIPE VECTOR USING ALL CODEWORDS FROM SELECT PAGE — 510

RUN ONE OR MORE OF PREDEFINED SUBSET OF PAGE-LEVEL REH STAGES {1,...K} ON EACH OTHER PAGE OF STRIPE AND UPDATE STRIPE VECTOR — 512

REPEAT FOR ANOTHER FAILING CODEWORD OF SELECT PAGE

DECODE FAILING CODEWORD OF SELECT PAGE USING STRIPE VECTOR AS LAST UPDATED — 514

UPDATE STRIPE VECTOR BASED ON DECODED FAILED CODEWORD — 516

*FIG. 5*

PAGE-LEVEL AND STRIPE-BASED READ ERROR HANDLING

PRIORITY APPLICATION

This application claims the benefit of priority to U.S. Provisional Application Ser. No. 63/617,885, filed Jan. 5, 2024, which is incorporated herein by reference in its entirety.

TECHNICAL FIELD

Example embodiments of the disclosure relate generally to memory devices and, more specifically, to page-level and stripe-based read error handling for a memory system, such as a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 4 and 5 illustrate flow diagrams of example methods for page-level and stripe-based read error handling for a memory system, in accordance with some embodiments of the present disclosure.

DETAILED DESCRIPTION

Figure 1:
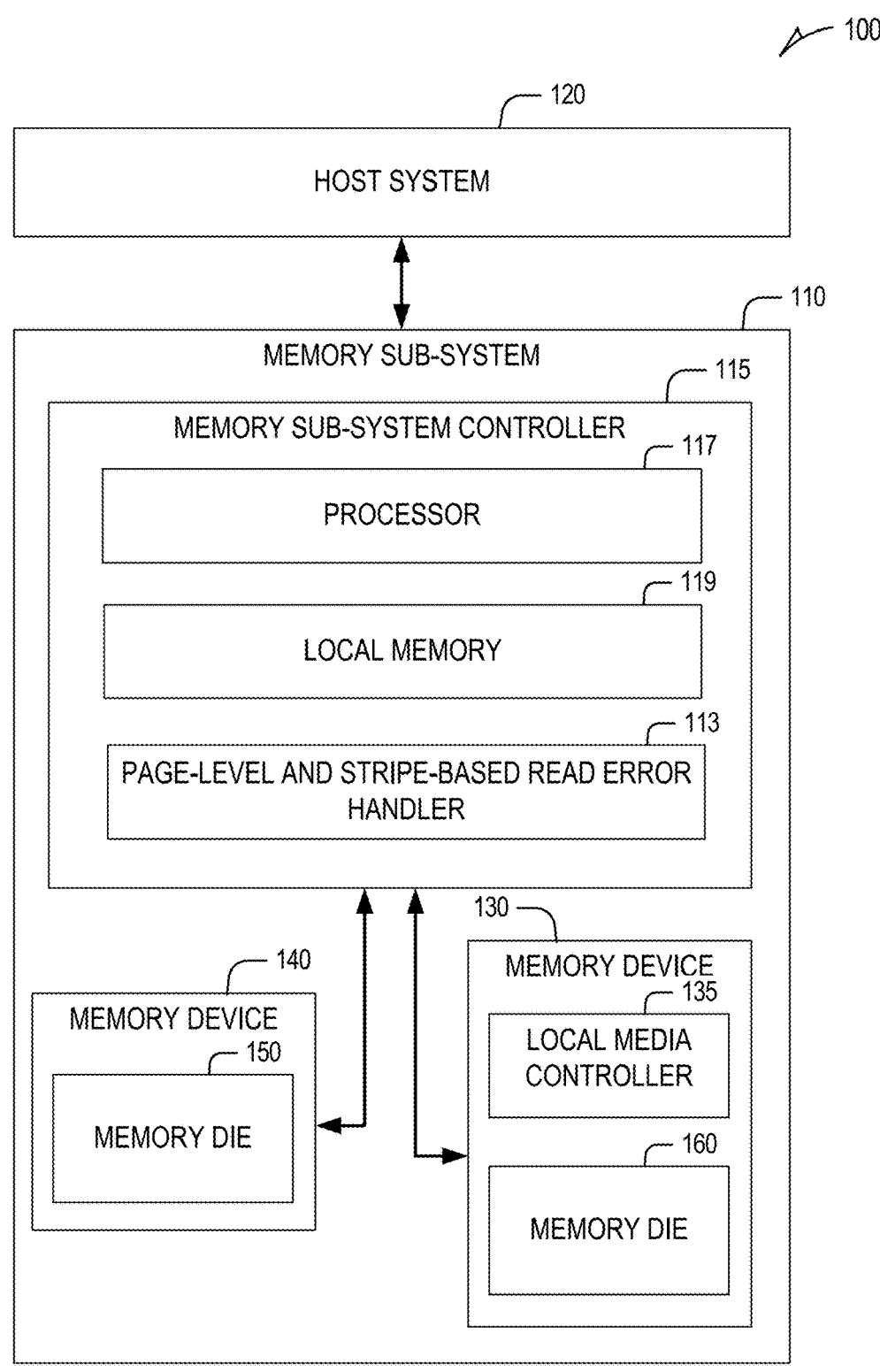
FIG. 1 is a block diagram illustrating an example computing system that includes a memory sub-system, in accordance with some embodiments of the present disclosure.

Aspects of the present disclosure are directed to page-level and stripe-based read error handling for a memory system, such as a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write commands, read commands) to the memory sub-system, such as to store data on a memory device at the memory sub-system, read data from the memory device on the memory sub-system, or write/read constructs with respect to a memory device on the memory sub-system. The data to be read or written, as specified by a host request (e.g., data access request or command request), is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error-correcting code (ECC) codeword, parity code), data version (e.g., used to distinguish age of data written), valid bitmap (which LBAs or logical transfer units contain valid data), and so forth.

The memory sub-system can initiate media management operations, such as a write operation on host data that is stored on a memory device or a scan (e.g., media scan) of one or more blocks of a memory device. For example, firmware of the memory sub-system can re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table (also referred to herein as an L2P table), data from logging, scratch pad data, and so forth).

A memory device can be a non-volatile memory device. A non-volatile memory device is a package of one or more die. Each die can comprise one or more planes. For some types of non-volatile memory devices (e.g., NOT-AND (NAND)-type devices), each plane comprises a set of physical blocks. For some memory devices, blocks are the smallest area that can be erased. Each block comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package.

Generally, writing data to such memory devices involves programming (by way of a program operation) the memory devices at the page level of a block, and erasing data from such memory devices involves erasing the memory devices at the block level (e.g., page level erasure of data is not possible). Certain memory devices, such as NAND-type memory devices, comprise one or more blocks, (e.g., multiple blocks) with each of those blocks comprising multiple pages, where each page comprises a subset of memory cells of the block, and where a single wordline of a block (which connects a group of memory cells of the block together) defines one or more pages of a block (depending on the type of memory cell). Depending on the embodiment, different blocks can comprise different types of memory cells. For instance, a block (a single-level cell (SLC) block) can comprise multiple SLCs, a block (a multi-level cell (MLC) block) can comprise multiple MLCs, a block (a triple-level cell (TLC) block) can comprise multiple TLCs, a block (a quad-level cell (QLC) block) can comprise QLCs, and a block (a penta-level cell (PLC) block) can comprise PLCs. Other blocks comprising other types of memory cells (e.g., higher-level memory cells, having higher bit storage-per-cell) are also possible.

Each worldline (of a block) can define one or more pages depending on the type of memory cells (of the block) connected to the wordline. For example, for an SLC block, a single wordline can define a single page. For a MLC block, a single wordline can define two pages—a lower page (LP) and an upper page (UP). For a TLC block, a single wordline can define three pages—a lower page (LP), an upper page (UP), and an extra page (XP). For a QLC block, a single wordline can define four pages—a lower page (LP), an upper page (UP), an extra page (XP), and a top page (TP) page. As used herein, a page of LP page type can be referred to as a "LP page," a page of UP page type can be referred to as a "UP page," a page of XP page type can be referred to as a "XP page," and a page of TP page type can be referred to as a "TP page." Each page type can represent a different level of a cell (e.g., QLC can have a first level for LPs, a second level for UPs, a third level for XPs, and a fourth level for TPs). To write data to a given page, a wordline associated with the given page is programmed according to a page programming algorithm (e.g., that causes one or more voltage pulses or pulses to memory cells of a block based on the memory). Generally, programming a single wordline of a block results all the pages in the single wordline being programmed, where the number pages being programmed depends on the type of block. For example, programming a single wordline of a QLC block usually results in four pages (e.g., LP, UP, XP, TP pages) associated with the single wordline being programmed.

In conventional memory systems (e.g., memory subsystems), each page of a block (of a memory device) comprises a certain number of codewords, where each codeword comprises a payload portion (or payload) for storing a certain number of data sectors (or sectors) that store data (or host data) from a host system, and where each codeword comprises a non-payload portion that can include protection data (e.g., parity data, such as low-density parity-check (LDPC) data) for protecting (e.g., facilitating error correction) of all the data in the codeword. The non-payload portion can also include protection information, cyclic redundancy check (CRC) data, and metadata (e.g., security metadata and firmware metadata), and the like. For instance, the size of a sector used by a host system can be set to 512 bytes, and NAND-type memory devices can be configured with 16-kilobyte pages each comprising four 4096-byte codewords, and with each codeword comprising a payload that stores eight 512-byte sectors and comprising parity data for facilitating error correction of the host data stored in the payload. Depending on the memory cell type, a reading of a wordline can comprise one or more pages (e.g., 16-kilobyte pages) being read at a given time. For instance, reading a wordline of a SLC block can result in the reading of one 16-kilobyte page, reading a wordline of a MLC block can result in the reading of two 16-kilobyte pages (UP and LP), reading a wordline of a TLC block can result in the reading of three 16-kilobyte pages (UP, LP, XP), and reading a wordline of a QLC block can result in the reading of four 16-kilobyte pages (UP, LP, XP, and TP). A given block (e.g., SLC, MLC, TLC, QLC block) can comprise multiple wordlines.

Different groups of memory cells of a memory device can have different bit error rates in reading the states of the memory cells and thus the data represented by the states. For example, bit error rates can differ from wordline to wordline, from page type to page type, or from die to die. For instance, error rate differences can result from variations in manufacturing processes, or intrinsic properties of the design or layout of circuits on an integrated circuit die. As a result, certain physical memory addresses have better error rates, and other physical memory addresses have worse. The error rates that dictate reliability consideration are from the worst-case stresses the memory device may be subjected to, such as reading and writing at extreme temperatures, or reading after years of being powered off. Overall, the worst error rates can be different based on various factors, such as memory addresses, memory locations (e.g., wordlines), stress (e.g., operating temperature), usage patterns (e.g., power off periods), etc.

To provide reliable error recovery for the worst-performing groups of memory cells, a memory device is usually designed to support storage of sufficient redundant information for each codeword. Additionally, to avoid a memory device having unnecessary memory cells configured for high performance groups of memory cells, the memory device can be designed to provide sufficient support for a majority of memory cell groups to recover bit errors by decoding codewords, and dynamically deploying an additional level of error correction technique for select memory cell groups that have higher bit error rates (to improve error recovery capability of the select memory cell groups). The dynamic error correction technique can comprise dynamically adjusting the amount of redundant information stored in memory cells of a wordline based on a bit error rate of those memory cells. For example, in response to determining that a bit error rate of the wordline is above a threshold value, the memory system can store first data items as independent first codewords of an error correction code technique into a first portion of the memory cells of the wordline, generate second data items as redundant information from the first codewords, and store the second data items in a second portion of the memory cells of the wordline. If the bit error rate is below the threshold value, third data items can be stored as independent second codewords of the same length as the first codewords in the memory cells of the wordline.

Figure 2:
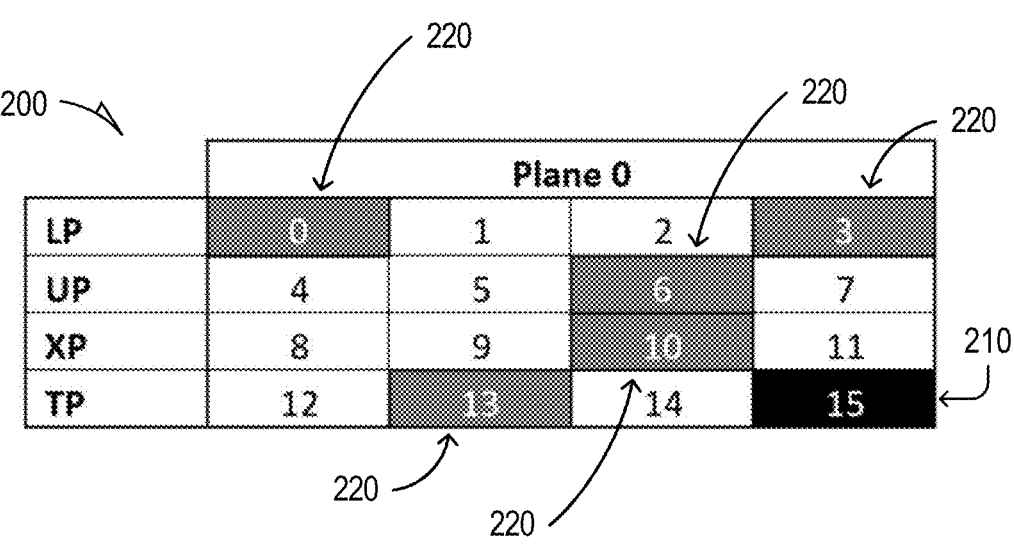
FIG. 2 is a diagram illustrating an example stripe that can be used in connection with various embodiments of the present disclosure.

The dynamic error correction technique can be implemented by using dynamic exclusively OR-ing (DynamicXOR) stripes, where parity data (or parity) of each stripe is generated by exclusive OR-ing (XORing) two or more codewords (e.g., translation units) across different page types (of the memory cells) associated with one or more wordlines (e.g., within a single plane within a single NAND die, or across different planes of the single NAND die). Such a dynamic error correction technique can be applied to TLC, QLC, PLC, or other-level-cell (e.g., other multi-bit-per-cell) blocks. The parity data generated can be stored within the same wordline (e.g., as one of the codewords stored on a plane), or stored within another wordline (e.g., in the same block or a different block). FIG. 2 illustrates an example of this error correction technique being used. In particular, codewords (e.g., translation units) 0 through 14 of plane 0 of a NAND die (that comprises QLC blocks) can define a DynamicXOR stripe in FIG. 2, with codeword 15 being used to store parity data for the stripe. At 202, during a write operation, a parity codeword (pCW) (comprising parity data) for a stripe comprising codewords 0 through 14

(CW_0 through CW_14) is generated by XORing codewords 0 through 14 (pCW=CW_0⊕CW_1⊕CW_2⊕CW_3⊕CW_4⊕CW_5⊕CW_6⊕CW_7⊕CW_8⊕CW_9⊕CW_10⊕CW_11⊕CW_12⊕CW_13⊕CW_14) across the pages types (LP, UP, XP, TP) of plane 0, and the resulting parity codeword is stored in codeword 15 (CW15), thereby storing the parity data in the same wordline. It will be understood that other stripes across different page types can also be defined.

Eventually, a reading of a given codeword (e.g., codeword (CW3)) can be requested, such as by a host system (e.g., a host read request comprising a logical memory address that translates to a physical memory address corresponding to the given codeword). Based on the read request, a host system can read a page associated with the given codeword, and attempt to decode the given codeword using a decoding methodology, such as LDPC decode process (e.g., implemented by an LDPC decoder). If the decode of the (requested) given codeword fails, data recovery of the given codeword can be attempted based on the DynamicXOR stripe. For example, assume codeword 3 (CW3) was requested by a host system and decode (e.g., LDPC decoding) of CW3 failed. At 204, assuming the DynamicXOR stripe comprises codewords 0 through 15 with codeword 15 storing the parity data for the stripe, data recovery can comprise attempting to decode all other codewords of the stripe (CW0 through 2, CW4 through CW14, and CW15), and generating (or updating) a vector (e.g., stripe vector or S vector) by XORing decoded bits (e.g., hard information bits, or hard bits) of passing codewords (e.g., codewords for which decoding succeeded) with un-decoded (raw) bits of failing codewords (e.g., codewords for which decoding initially failed). For example, if we were to assume codewords (e.g., translation units) 0, 3, 6, 10, 13 are failed (e.g., errored) codewords, a vector can be generated (or updated) by XORing decoded bits (e.g., hard information bits, or hard bits) of passing codewords 1, 2, 4, 5, 7, 8, 9, 11, 12, 14, 15 (with codeword storing the previously-generated parity data) and un-decoded (raw) bits of failing codewords 0, 3, 6, 10, 13 as follows: vector=CW_0⊕DECODED(CW_1)⊕DECODED(CW_2)⊕CW_3⊕DECODED(CW_4)⊕DECODED(CW_5)⊕CW_6⊕DECODED(CW_7)⊕DECODED(CW_8)⊕DECODED(CW_9)⊕CW_10⊕DECODED(CW_11)⊕DECODED(CW_12)⊕CW_13⊕DECODED(CW_14)⊕DECODED(CW_15). The resulting vector can be used as an input (e.g., soft information input or soft-input) for decoding (e.g., using LDPC) any of failed codewords 0 through 15 (e.g., codewords 0, 3, 6, 10, 13) of the stripe, such as codeword 3 (CW3). For example, one bit from the resulting vector can be used as soft information-input data (e.g., in addition to soft information-input data) to an LDPC decode process that receives one or more hard information bits and one or more soft information bits with respect to a memory cell.

Unfortunately, conventional methodologies for using DynamicXOR stripes suffer at least one drawback-long read error handling (REH) latency. Specifically, a REH process is usually performed for each page, where the REH process comprises multiple stages (e.g., stages {1, 2, . . . , K, K+1}) that each represent a different REH (e.g., page-level) technique for recovering data from an individual page that fails to be read by a read operation, and where individual stages of the REH process are consecutively attempted/performed until one of the stages successfully results in reading of the individual page. Conventional DynamicXOR read error handling represents only one stage of the REH process. Where one or more stages of a REH process fail to recover data from the individual page (decoded data from a given codeword of the individual page, such as CW0 of FIG. 2 of a stripe), conventional methodologies of using a DynamicXOR stripe (as a stage of a read error handling process) to recover data for the given codeword can result in multiple stages (e.g., one or more prior stages) of the REH process being executed (or performed) for each other pages containing a codeword of the DynamicXOR stripe (e.g., each page comprising CW4 through CW15 of FIG. 2, as the individual page already comprises CW1, CW2, and CW3) to generate or update a vector (e.g., S vector). Additionally, conventional methodologies for using DynamicXOR stripes can result in the whole process (of executing REH separately for each page of the stripe) being repeated for each failed codeword of the (same) stripe from which stored data is being requested (e.g., by a host system). Such conventional methodologies for using DynamicXOR stripes can be regarded as codeword-level (or TU-level) DynamicXOR REH.

Various embodiments described herein cure these and other deficiencies of conventional methodologies for using DynamicXOR stripes. In particular, some embodiments described herein provide for page-level stripe-based read error handling for a memory system, such as a memory sub-system. For instance, an embodiment described herein can implement a page-level DynamicXOR read error handling (REH). The page-level stripe-based read error handling of some embodiments can implement an individual stage of a multi-stage read error handling process, which can be performed on (e.g., applied to) a codeword (also referred to herein as a failing codeword) that fails to initially decode using a decode process, such as an LDPC decode process. As used herein, a passing codeword can refer to a codeword that successfully decodes using a decode process (e.g., LDPC) without detection of an error. As used herein, a failing codeword can refer to a codeword that a decode process (e.g., LDPC) fails to decode (e.g., decode process raises a decoding error).

According to some embodiments, a read error handling process is performed in response to an error being detected during performance of a page-level read operation on a select page (e.g., LP, XP, UP, or TP page of a QLC block) of a memory device (e.g., of a memory sub-system). The page-level operation can be performed (e.g., by a memory sub-system) in response a read request or command, received from a host system, for data (e.g., host data) stored in the select page. As described herein, the read error handling process can comprise multiple stages, where each stage is attempted/performed consecutively until data can be successfully read from the select page. Page-level and stripe-based read error handling, as described by the following, can be performed as one of the stages of the (larger) read error handling process.

During the page-level and stripe-based read error handling, a first buffer space can be allocated to store (e.g., retain) one or more bits of hard information data and one or more soft information data determined for the select page (e.g., LP page of a QLC block). Initially, a stripe associated with the select page (e.g., a stripe formed in part by codewords of the select page) can be identified. A stripe vector (e.g., s-vector) for the stripe can be generated based on (e.g., using) decoded hard information data of each passing codeword (e.g., each passing translation unit) of the select page and the undecoded hard information data of each failing codeword (e.g., failing translation units) of the select page. For instance, where codeword 0 (CW0) is a passing codeword of the select page and each of codewords 1, 2, 3

(CW1, CW2, CW3) is a failing codeword of the select page, then the stripe vector can be set to decoded(CW0)⊕undecoded(CW1)⊕undecoded(CW2)⊕undecoded(CW3), where ⊕ is the XOR operator and where CWx represents the hard information data for codeword x. Additionally, hard information data and soft information data (e.g., one hard bit-two soft bit (1H2S) information data) of each failing codeword (e.g., CW1, CW2, CW3) of the select page are stored in the first buffer space. Subsequently, for each other page (e.g., XP, UP, TP page) that comprises codewords (e.g., translation units) that form part of the stripe, a second data buffer can be allocated to store hard information data and soft information data (e.g., 1H2S information data) for the other path, the hard information data and the soft information data of the other page can be stored on the second data buffer, and stripe vector can be updated using the decoded hard information data of each passing codeword of the other page and stored undecoded hard information data of each failing codeword of the other page, where the stored undecoded hard information data is retrieved from the second buffer space. For instance, where codeword 1 (CW1) is a passing codeword of the other page and each of codewords 0, 2, 3 (CW1, CW2, CW3) is a failing codeword of the other page, then the stripe vector can be updated by setting stripe vector=stripe_vector_as_last_updated/generated⊕decoded (CW1)⊕undecoded(CW0)⊕undecoded(HB_CW2)⊕undecoded(CW3), where ⊕ is the XOR operator and where CWx represents the hard information data for codeword x. The decoded hard information data of each passing codeword of the other page can be obtained using a decode process or, if a decode error occurs, by performing one or more stages of a predefined set of page-level read error handling stages on the other page (e.g., predefined set of read error handling stages that does not include performing page-level and stripe-based read error handling on the other page). As noted, this process can be repeated for each other page (e.g., XP, UP, TP page) that comprises codewords that form part of the stripe, where the (second) buffer space is allocated once and then reused for each of the other pages, or where new buffer space is allocated for each other page.

After the stripe vector has been updated using each of the other pages (e.g., XP, UP, TP page) associated with the stripe, a single failed codeword of the select page (e.g., LP page) can be decoded using the stripe vector (as last updated), stored soft information data for the single failed codeword retrieved from the first buffer space, and stored hard information data for the single failed codeword retrieved from the first buffer space. In particular, decoded hard information data of the single failed codeword can be determined (e.g., generated) by decoding the stored hard information data (retrieved from the first buffer space) for the single failed codeword using a decode process (e.g., an LDPC decode process), where both the stripe vector as last updated and the stored soft information data (retrieved from the first buffer space) for the single failed codeword are used as soft-input data to the decode process. Subsequently, the stripe vector can be updated based on the decoded hard information data of the single failed codeword and the stored undecoded hard information data (retrieved from the first buffer space) for the single failed codeword. For instance, the stripe can be updated by setting stripe vector=stripe_vector_as_last_updated/generated⊕decoded (hard_information_data_of_single_failed_codeword)⊕undecoded(stored_hard_information_data_of_single_ failed_codeword), where ⊕ is the XOR operator. The stripe as updated can then be used to decode the stored hard information data (retrieved from the first buffer space) for another single failed codeword of the select page, and the stripe vector can be updated using the resulting decoded data (in a manner similar to the single failed codeword). These steps can continue to repeat for each failed codeword of the select page, with each repetition strengthening the value of the stripe vector for use as a soft-input data to a decode process (e.g., LDPC decode process). Eventually, one or more codewords that are successfully decoded using the page-level and stripe-based read error handling can be provided to a requestor (e.g., a host system that originally requested host data stored by the one or more codewords).

By use of various embodiments, stripe-based read error handling can be performed at the page level rather than at a codeword (or translation unit) level, which can reduce the overall latency of a read error handling (REH) process (e.g., a multi-stage REH process). Additionally, the use of various embodiments can reduce the amount of memory space (e.g., buffer space) used during the stripe-based read error handling. For instance, some embodiments can limit the use of buffer space to store two pages-a first buffer space to store undecoded data of a single page that comprises a codeword (e.g., translation unit) of interest, and a second buffer space to store a single other page of the stripe that is read and used (e.g., to update a stripe vector) one at a time and that can be removed/replaced for another single page of the stripe (e.g., read and used to update the stripe vector).

As used herein, a translation unit (TU) of a memory device can comprise (e.g., store) one or more codewords, and can be referenced by a physical memory address (or physical address) of the memory device. For various embodiments, a logical memory address (or logical address) of a memory system is translated into a physical memory address of a memory device.

As used herein, a stripe can comprise a plurality of elements of a memory device, such as pages or codewords (e.g., translation units) of one or more pages, that is grouped together for a read error correction technique (e.g., parity-based error correction). An example of a stripe can include a DynamicXOR stripe as described herein. For example, a DynamicXOR stripe can comprise a plurality of codewords 1 through N that are exclusively-OR'd together to generate parity data (or parity) for the DynamicXOR stripe, where the generated parity can be later used (e.g., to generate a stripe vector that is used) to decode (e.g., assist in decoding) an individual codeword of the dynamic XOR stripe that is failing to decode without an error. Though various embodiments may be described herein with respect to a stripe (e.g., DynamicXOR stripe) that comprises codewords 0 through 14, that has codeword 15 as parity data for the stripe, and that has codewords 0 through 15 stored across pages in a single QLC block (e.g., as shown in FIG. 2), the structure and size of stripes can vary between different embodiments.

As used herein, hard information data (or hard bits) can comprise one or more bits determined based on detecting a voltage charge currently stored (e.g., or held) by a memory cell (of a block of a memory device) and based on one or more hard voltage thresholds (or hard thresholds) associated with the memory cell. For various embodiments, hard information data determined for a memory cell represents a data value actually stored by the memory cell. A hard voltage threshold (or hard threshold) of a memory cell can refer to a discrete voltage threshold level (or discrete threshold level) that separates different ranges (or windows) of voltage charge that the memory cell can store and the different data values represented by each of those different ranges (or windows). For instance, a memory cell of a QLC block can store 4-bits, and can have 16 windows for values (e.g., binary values of 0000 to 1111) separated by 15 discrete threshold levels.

As used herein, soft information data (or soft bits) of a memory cell can comprise one or more bits that indicate where the voltage charge (detected as being stored by a memory cell) lies between two hard thresholds of the memory cell, thereby providing higher-resolution information regarding the voltage charge currently stored by the memory cell (than provided by hard information data alone). Specifically, soft information data can indicate how close a voltage charge sampled/detected from a memory cell is to a hard threshold of the memory cell and, therefore, indicate the probability that the voltage charge (sampled/detected from the memory cell) was sampled/detected correctly. In this way, soft information data can represent the reliability, confidence level, or probability of the hard information data (hard bits) read from one or more memory cells of a memory device, where such the reliability/confidence level/probability can be useful in data error correction techniques. Soft information data can be determined based on detecting a fractional component of a voltage charge currently stored by the memory cell and based on fractional voltage thresholds (e.g., soft thresholds). For instance, where a sampled/detected voltage charge of a memory cell of a TLC block falls between a first voltage threshold and a second voltage threshold, and the hard bits are determined to comprise "101," the soft bit information (e.g., bit value of "1" or "0") can indicate whether the sampled/detected voltage charge is closer to the first voltage threshold or the second voltage threshold and the probability of an error in the sampling/ detection of the voltage charge. Where hard information data accompanied by soft information data that indicates a voltage charge sampled/detected from a memory cell is close to a hard threshold of the memory cell, that voltage charge has a lower probability of being correct than a voltage charge sampled/detected with soft information that indicates the voltage charge sampled/detected is centered between two hard thresholds. Decode processes (e.g., signal processing algorithms), such as a Low Density Parity Codes (LDPC) process, can use hard information data for a memory cell and soft information data for the memory cell (e.g., in terms of error probabilities) to determine (e.g., decode) a data value stored by the memory cell.

As used herein, undecoded data of a given page of a memory device can comprise undecoded hard information data obtained (e.g., as part of a page-level read operation performed on the given page) for a plurality of memory cells of the memory device that form the given page and store the actual (raw) data of the given page. Undecoded data for a given codeword of the given page can comprise those portions of hard information data that are obtained (from the memory device) for the given page and that correspond to memory cells storing the actual (raw) data of the given codeword.

As used herein, decoded data of a codeword can comprise decoded hard information data generated by successfully decoding the undecoded hard information data of the codeword (e.g., by a decode process or with use of a read error handling when the decode process fails). For some embodiments, a given codeword is decoded by decoding (without error) hard information data of the given codeword using the soft information data of the given codeword (e.g., as soft input to a decode process). In the event an error is encountered during the decoding, a read error handler process (as described herein) can be performed or triggered, which can recover the decoded data from the (failing) codeword using one or more error recovery techniques. An example of hard information data and soft information obtained for one or more memory cells (e.g., a given page or a given codeword) of a memory device can include, without limitation, one hard bit-two soft bit (1H2S) information for each of the memory cells.

Disclosed herein are some examples of page-level and stripe-based read error handling for a memory system, as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory devices 130, 140 when the memory sub-system 110 is coupled with the host system 120 by the PCIe or CXL interface. The physical host interface can provide an interface for passing control, address, data, and other signals between the memory sub-system 110 and the host system 120.

FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include a NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130 can include one or more arrays of memory cells. One type of memory cell, for example, SLCs, can store one bit per cell. Other types of memory cells, such as MLCs, TLCs, QLCs, and penta-level cells (PLCs), can store multiple or fractional bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. As used herein, a block comprising SLCs can be referred to as a SLC block, a block comprising MLCs can be referred to as an MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands, requests, or operations from the host system 120 and can convert the commands, requests, or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., LBA, namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

Each of the memory devices 130, 140 include a memory die 150, 160. For some embodiments, each of the memory devices 130, 140 represents a memory device that comprises a printed circuit board, upon which its respective memory die 150, 160 is solder mounted.

The memory sub-system controller 115 includes a page-level and stripe-based read error handler 113 that enables or facilitates the memory sub-system controller 115 to perform page-level and stripe-based read error handling as described herein. Some or all of the page-level and stripe-based read error handler 113 is included by the local media controller 135 to facilitate the implementation of page-level and stripe-based read error handling on the memory sub-system 110 as described herein.

FIG. 2 is a diagram illustrating an example stripe 200 that can be used in connection with various embodiments of the present disclosure. As shown, the stripe 200 is formed by codewords 0 through 14, with codeword 15 (210) storing parity data (or parity) for the stripe. Codewords 0 through 15 are stored across pages LP, UP, XP, TP of a QLC block on plane 0 of NAND-based memory device die. Codewords 0 through 3 are part of the LP page, codewords 4 through 7 are part of the UP page, codewords 8 through 11 are part of the XP page, and codewords 12 through 15 are part of the TP page. In FIG. 2, codewords 0, 3, 6, 10, 13 can represent failing codewords 220 of the stripe 200.

Figure 3:
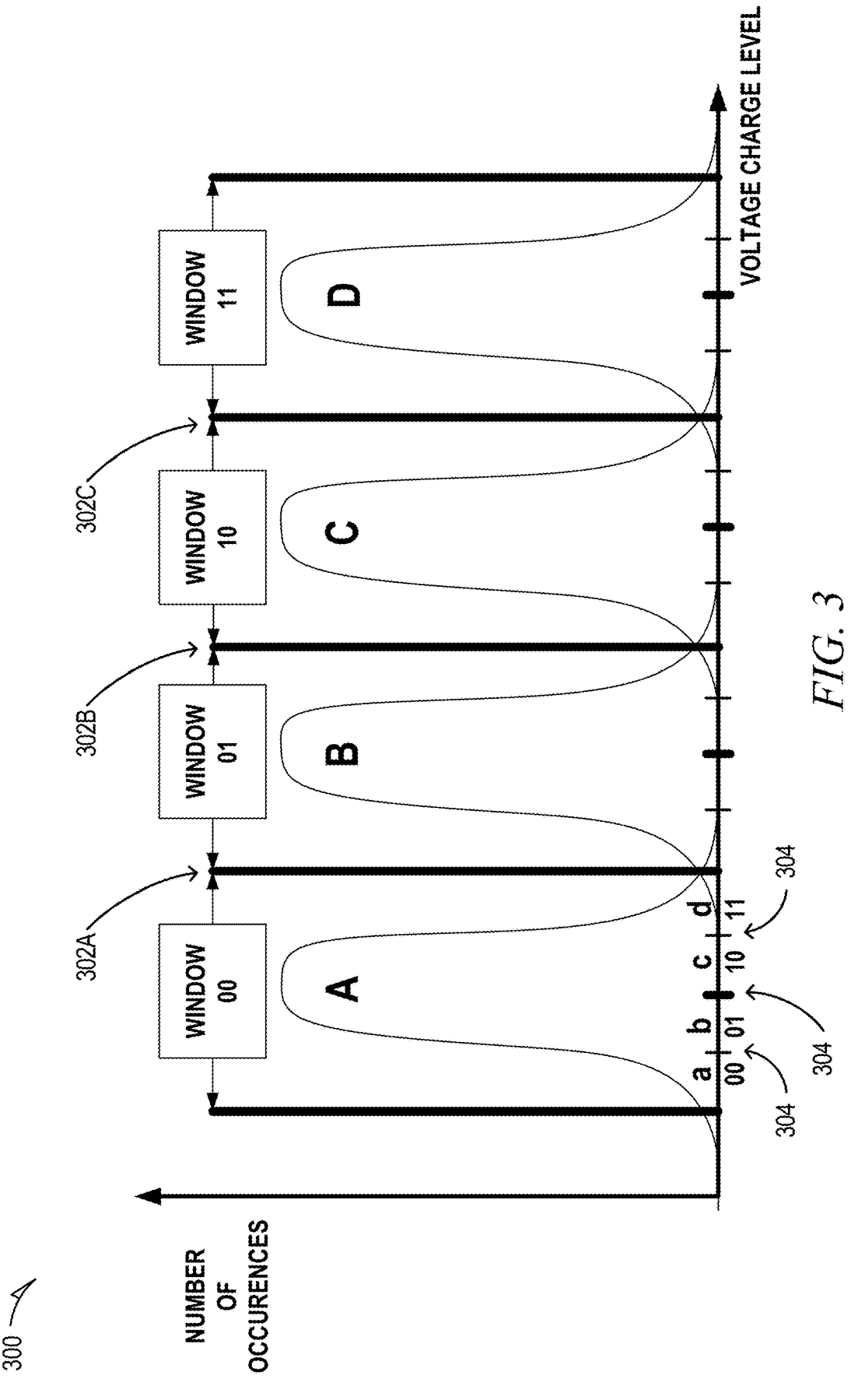
FIG. 3 is a diagram illustrating an example set of distributions of data values stored by a memory cell with respect to hard information and soft information windows, in accordance with various embodiments of the present disclosure.

FIG. 3 is a diagram illustrating an example set of distributions 300 of data values stored by a memory cell with respect to hard information and soft information windows, in accordance with various embodiments of the present disclosure. Referring now to FIG. 3, a 2-bit per cell memory device is illustrated as comprising a total of 4 voltage charge ranges, areas or windows of information A-D divided by three threshold levels which are designated as 302A, 302B and 302C. By way of example, a 4-bit per cell device has 16 windows for values to be written with 15 threshold levels separating these values. As described herein, the discrete voltage thresholds separating the information values can be referred to as hard voltage thresholds. Data detection using hard voltage thresholds can be referred to as slicer detection. Data (e.g., bits) represented by hard voltage thresholds can be referred to herein as hard information data (e.g., hard bits). Soft information data (e.g., soft bits) can indicate where a value lies between the hard voltage thresholds and can be referred. Soft information data relates to how close a particular sample is to a hard threshold and therefore to the probability that the voltage sampled was sample/detected correctly. In FIG. 3, each hard information window 00-11 is over sampled with an additional 2 bits of soft information data. The voltage range of each hard information window is divided into four sub-ranges that are designated as a-d for hard window 00. The sub-ranges are separated within each hard window by three soft voltage thresholds 304, a number of which are specifically designated. A total of 16 soft window areas, or 4 bits, are therefore used to describe 2 bits of user data. The number of soft information bits can be extended indefinitely. For instance, a memory cell storing 4-bits of data can be oversampled by 3 additional soft information bits, and can require 7 bits (4 hard information bits and 3 soft information bits) of data to fully describe the 4 bits of data stored by a memory cell. Each hard information window can correspond to a voltage range of the memory cell, and each soft information window can correspond to a voltage sub-range within one of the hard information windows.

Figure 4:
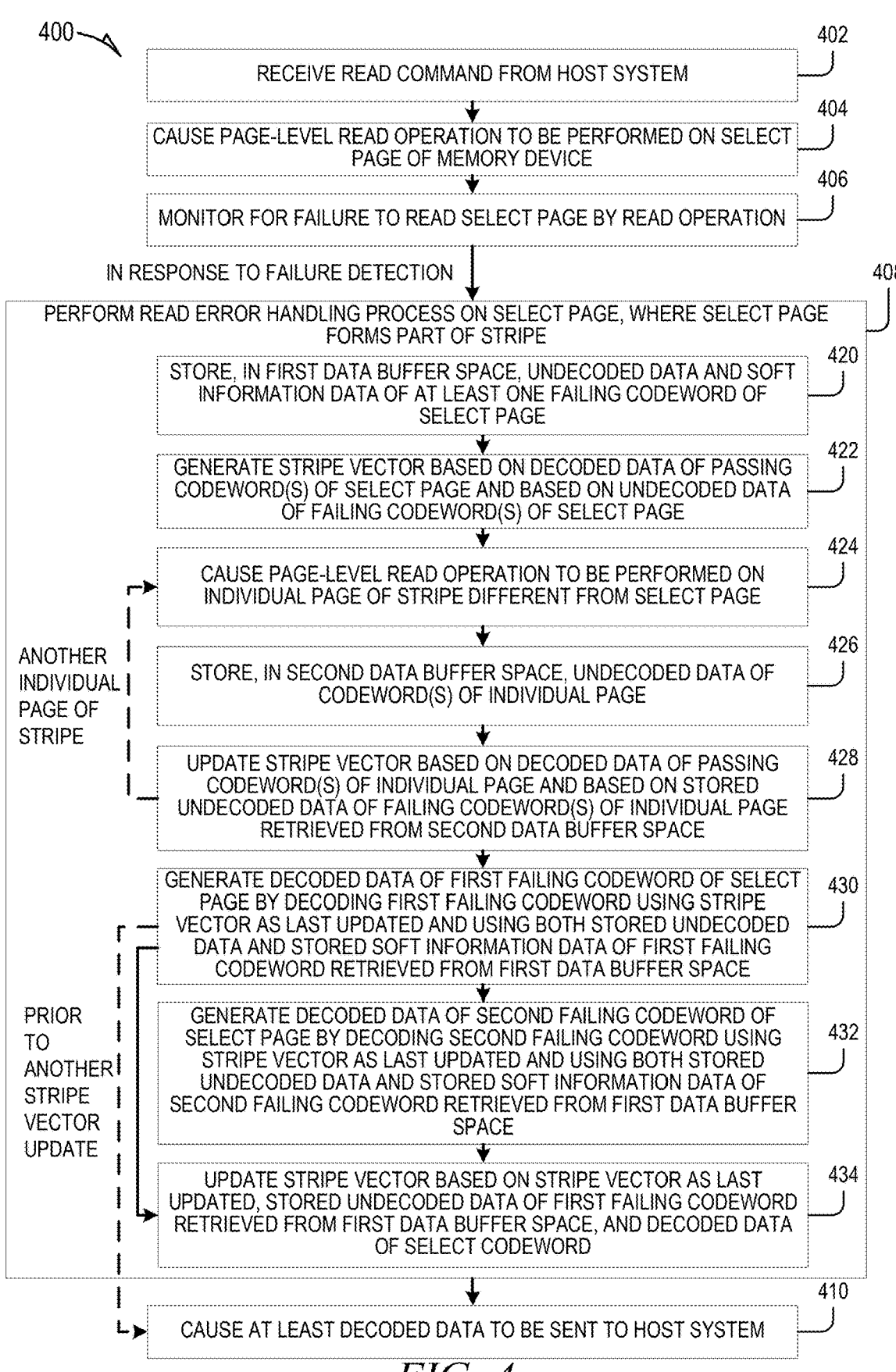

FIGS. 4 and 5 illustrate flow diagrams of example methods 400, 500 for page-level and stripe-based read error handling for a memory system, in accordance with some embodiments of the present disclosure. Any of methods 400, 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more of methods 400, 500 is performed by the memory sub-system controller 115 of FIG. 1 based on the page-level and stripe-based read error handler 113. Additionally, or alternatively, for some embodiments, one or more of methods 400, 500 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Referring now to method 400 of FIG. 4, at operation 402, a processing device (e.g., the processor 117 of the memory sub-system controller 115) receives a read command (e.g., a host read command or request) from a host system (e.g., the host system 120 operatively coupled to the memory sub-system 110). Alternatively, the read command can be one that is internally generated by a memory sub-system, such as for an internal operation (e.g., management operation, such as garbage collection). According to some embodiments, the processing device generates a set of memory operations (e.g., memory media operations) based on the host command received by operation 402.

In response to the read command, at operation 404, the processing device (e.g., the processor 117) causes a page-level read operation to be performed on a select page of a memory device (e.g., 130, 140). The select page can be one of one or more pages from which stored data is being requested by the host system or the memory sub-system (e.g., 110). The page-level read operation can be part of the set of memory operations generated by the processing device based on the read command (e.g., from the host system or internally generated by the memory sub-system). During the page-level operation, undecoded hard information data and soft information data can be obtained for each codeword of the select page.

During the page-level read operation, at operation 406, the processing device (e.g., the processor 117) monitors (e.g., periodically checks) for a failure to read (e.g., a read error is triggered) the select page by the page-level read operation. In response to detecting a failure, at operation 408, the processing device (e.g., the processor 117) performs a read error handling process on the select page of the memory device, where the select page is part of a plurality of pages of the memory device that forms a stripe (e.g., DynamicXOR stripe for DynamicXOR REH). According to some embodiments, the read error handling process represents a page-level and stripe-based read error handling process described herein. Additionally, the read error handling process can represent a stage (e.g., a single stage K+1) of a larger, multi-stage read error handling process, which can attempt each read error handling stage consecutively until the data being requested is successfully read. During the read error handling process of operation 408, one or more of operations 420 through 434 can be performed.

At operation 420, the processing device (e.g., the processor 117) stores, in a first data buffer space of the memory sub-system (e.g., 110), hard information data and soft information data of at least one (e.g., each) failing codeword of the select page. Alternatively, the at least undecoded hard information data and soft information data can be stored during/by a prior stage of a larger, multi-stage read error handling process, and operation 420 causes retention of at least undecoded hard information data and soft information data of the at least one (e.g., each) failing codeword of the select page (if not the entire select page). For various embodiments, undecoded hard information data and soft information data for one or more codewords (e.g., each codeword) of the select page is obtained during/by the page-level read operation of operation of 404. For some embodiments, operation 420 comprises storing the select page (e.g., in its entirety) in the first data buffer space. Depending on the embodiment, the first data buffer space can be allocated on the memory sub-system as part of performing the read error handling process, or can be allocated prior to the performing the read error handling process. For some embodiments, the first data buffer is provided by (e.g., allocated on) a local memory of the memory sub-system, such as a local memory (e.g., 119) of a controller (e.g., 115) of the memory sub-system.

For operation 422, the processing device (e.g., the processor 117) generates a stripe vector (for the stripe) based on decoded hard information data of one or more passing codewords (e.g., each passing codeword) of the select page and based on the undecoded hard information data of one or more failing codewords (e.g., each failing codeword) of the select page. For instance, the stripe can be generated by setting the stripe vector to the combination of decoded (hard_information_data_of_each_passing_codeword) and undecoded(hard_information_data_of_each_failed_codeword), where an XOR operator ⊕ is used to combine the elements. For some embodiments, the undecoded hard information data of one or more failing codewords (e.g., each failing codeword) of the select page is obtained from the first data buffer space (as stored by operation 420).

According to some embodiments, operations 424 through 428 are performing one or more individual pages that comprise (e.g., each individual page that comprises) at least one codeword that forms part of the stripe. At operation 424, the processing device (e.g., the processor 117) causes a page-level read operation to be performed on an individual page of the stripe, where the individual page is different from the select page. For some embodiments, the page-level read operation results in hard information data and soft information being obtained for one or more codewords (e.g., each codeword) of the individual page.

For operation 426, the processing device (e.g., the processor 117) stores, in a second data buffer space of the system, undecoded hard information data of one or more codewords of the individual page (e.g., each codeword of the individual page). Additionally, for some embodiments, operation 426 also stores soft information data of one or more codewords of the individual page. According to some embodiments, the second data buffer is provided by (e.g., allocated on) a local memory of the memory sub-system, such as a local memory (e.g., 119) of a controller (e.g., 115) of the memory sub-system. Depending on the embodiment, second first data buffer space can be allocated on the memory sub-system as part of performing the read error handling process, or can be allocated prior to the performing the read error handling process. Additionally, depending on the embodiment, the second data buffer space can be allocated once with sufficient space to store a single page's worth of data (and commonly used to process each individual page of the stripe one at a time), allocated a first time with sufficient space to store a single individual page and allocated with additional space to store each additional individual page of the stripe processed by operations 424 through 428, or allocated once with sufficient space to store all of the individual pages of the stripe processed by operations 424 through 428.

At operation 428, the processing device (e.g., the processor 117) updates the stripe vector based on decoded hard information data of one or more passing codewords (e.g., each passing codeword) of the individual page and based on stored undecoded hard information data of one or more failing codewords (e.g., each failing codeword) of the individual page (stored on and) retrieved from the second data buffer space. For instance, the stripe can be updated by setting stripe vector=stripe_vector_as_last_updated⊕decoded(hard_information_data_of_second_failed_codeword)⊕undecoded (stored_hard_information_data_of_second_failed_codeword), where ⊕ is the XOR operator. After operation 428, method 400 can return to operation 424 for another (e.g., a next) individual page of the stripe to be processed by operations 424 through 428. For instance, the processing device causes the page-level read operation to be performed on the second individual page, stores (in the second data buffer space of the system) undecoded hard information data and soft information data of one or more codewords (e.g., each codeword) of the second individual page (e.g., where storage causes replacement of any undecoded hard information data and soft information data of a prior page), and updates the stripe vector based on decoded hard information data of one or more passing codewords of the second individual page and based on stored undecoded hard information data of one or more failing codewords of the second individual page (stored on and) retrieved from the second data buffer space. Where the stripe is formed by codewords from a single QLC block, the select page is a LP page of the QLC block, and a first individual page processed by operations 424 through 428 is a XP page of the QLC block, a next individual page can be a UP page or a TP page of the QLC block. Eventually, method 400 can proceed from operation 428 to operation 430.

During operation 430, the processing device (e.g., the processor 117) generates decoded hard information data of a first failing codeword of the select page by decoding the first failing codeword using the stripe vector as last updated (by operation 428) and using both stored undecoded hard information data and stored soft information data of the first failing codeword (stored on and) retrieved from the first data buffer space. For some embodiments, operation 430 comprises using a decode process, such as a low-density parity-check (LDPC) decode process, to decode the first failing codeword, where the decode process receives the stored undecoded hard information data of the first failing codeword as hard information-input data, and the decode process receives both the stored soft information data of the first failing codeword and the stripe vector as last updated as soft information-input data. For some embodiments, method 400 proceeds from operation 430 to operation 410 prior to another update to the stripe vector, where the processing device causes at least the decoded data of the decoded hard information data of the first failing codeword of the select page to be sent (or otherwise provided) to the host system (or an internal requestor of the memory sub-system). Alternatively, method 400 proceeds from operation 430 to operation 432, where hard information data of one or more other failing codewords of the select page are decoded prior to another update to the stripe vector.

Thereafter, at operation 432, the processing device (e.g., the processor 117) generates decoded hard information data of a second failing codeword by decoding the second failing codeword of the select page using the stripe vector as last updated (by operation 428) and using both stored undecoded hard information data and stored soft information data of the second failing codeword (stored on and) retrieved from the first data buffer space. For some embodiments, method 400 proceeds from operation 432 to operation 410, where the processing device causes at least the decoded data of the decoded hard information data of the second failing codeword of the select page to be sent (or otherwise provided) to the host system (or an internal requestor of the memory sub-system) prior to another stripe update. Additionally, for some embodiments, method 400 proceeds from operation 432 to operation 434, where the processing device updates the stripe vector based on the stripe vector as last updated, based on the stored undecoded hard information data of the second failing codeword (stored on and) retrieved from the first data buffer space, and based on the decoded hard information data of the second failing codeword. While operation 432 and 434 are described with respect to a second failing codeword, for some embodiments, operations 432 and 434 are repeated for each failing codewords (e.g., each failing codeword) of the select page.

For some embodiments, after the read error handling process has been performed, the processing device (e.g., the processor 117) causes decoded data of (e.g., generated by the read error handling processor for) at least one failing codeword (e.g., decoded data of the first failing codeword, decoded data of the second failing codeword, or both) to be sent to the host system or, alternatively, to an internal requestor (e.g., management operation, such as a garbage collection operation) of the memory sub-system.

Referring now to FIG. 5, method 500 represents an example multi-stage read error handling process that implements method 400 of FIG. 4 as stage K+1. At operation 502-1, a processing device (e.g., the processor 117 of the memory sub-system controller 115) performs page-level read error handling stage 1 on a select page of a memory device of a memory sub-system. At operation 504-1, if the processing device determines the select page recovered by page-level read error handling stage 1, method 500 proceeds to operation 506-1 where the processing device returns recovered data to a host system (e.g., 120) or an internal requestor of the memory sub-system (e.g., 110). If, however, the processing device determines the select page has not been recovered by page-level read error handling stage 1, method 500 proceeds to operation 502-2 to attempt one or more additional read error handling stages 2 through K consecutively until data of the select page is recovered, starting with read error handling stage 2. If read error handling stages 2 through K−1 fail to recover data of the select page, method 500 eventually reaches operation 502-K.

At operation 502-K, the processing device (e.g., the processor 117) performs page-level read error handling stage K on the select page of a memory device of a memory sub-system. At operation 504-K, if the processing device determines the select page recovered by page-level read error handling stage K, method 500 proceeds to operation 506-K where the processing device returns recovered data to a host system (e.g., 120) or the internal requestor of the memory sub-system (e.g., 110).

If, however, the processing device (e.g., the processor 117) determines the select page has not been recovered by page-level read error handling stage K+1, method 500 proceeds to operation 502-K+1, which can represent an implementation of method 400 of FIG. 4. During operation 502-K+1, the processing device (e.g., the processor 117) performs page-level read error handling stage K+1 on the select page, where page-level read error handling stage K+1 comprises page-level stripe-based read error handling in accordance with various embodiments. As shown, operations 510 through 516 are performed as part of operation 502-K+1.

At operation 510, the processing device (e.g., the processor 117) generates a stripe vector for a stripe using all codewords from the select page, where codewords of the select page form part of the stripe. Then, at operation 512, the processing device runs one or more of a predefined subset of read error handling stages $\{1, \ldots, K\}$ (and not including stage K+1) on each other page of the stripe and update the stripe vector using the recovered data of each of the other pages of the stripe. Thereafter, at operation 514, the processing device decodes an individual codeword of the select page using the stripe vector as last updated (by operation 512). In the event there is another failing codeword of the select page to be decoded, method 500 can proceed from operation 514 to operation 516, where the processing device updates the stripe vector based on the decoded failing codeword (decoded by operation 514) and, thereafter, method 500 can return to operation 514 to repeat operation 514 for another failing codeword of the select page. Though not shown, if read error handling stage K+1 fails to recover data of the select page, one or more additional read error handling stages (e.g., stage K+2) can be attempted.

Figure 6:
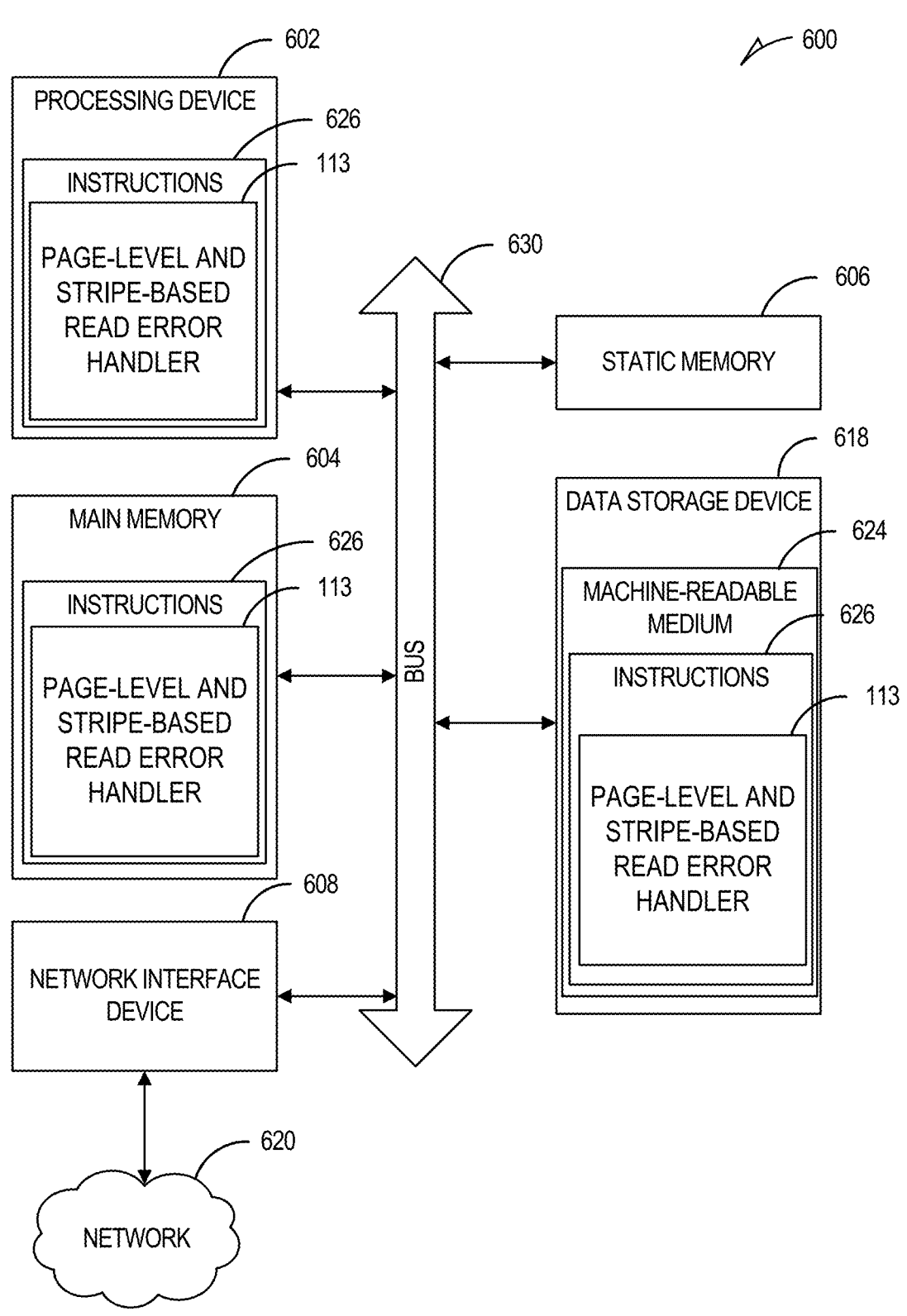
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application-specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage device 618 can include a machine-readable storage medium 624 (also known as a computer-readable medium) on which is stored one or more sets of instructions 626 or software embodying any one or more of the methodologies or functions described herein. For some embodiments, the machine-readable storage medium 624 is a non-transitory machine-readable storage medium. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage device 618, and/or main memory 604 can correspond to the memory sub-system 110 of FIG. 1.

In one embodiment, the instructions 626 include instructions to implement functionality corresponding to page-level and stripe-based read error handling on a memory system as described herein (e.g., the page-level and stripe-based read error handler 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

In view of the above-described implementations of subject matter this application discloses the following list of examples, wherein one feature of an example in isolation or more than one feature of an example, taken in combination and, optionally, in combination with one or more features of one or more further examples are further examples also falling within the disclosure of this application.

Example 1 is a system comprising: a memory device; and a processing device, operatively coupled to the memory device, configured to perform operations, the operations comprising performing a read error handling process on a select page of the memory device, the select page being part of a plurality of pages of the memory device that forms a stripe, the read error handling process comprising: storing, in a first data buffer space of the system, undecoded hard information data and soft information data of at least one failing codeword of the select page; generating a stripe vector for the stripe based on decoded hard information data of one or more passing codewords of the select page and based on the undecoded hard information data of one or more failing codewords of the select page; for an individual page of the stripe different from the select page: causing a page-level read operation to be performed on the individual page; storing, in a second data buffer space of the system, undecoded hard information data of one or more codewords of the individual page; and updating the stripe vector based on decoded hard information data of one or more passing codewords of the individual page and based on stored undecoded hard information data of one or more failing codewords of the individual page retrieved from the second data buffer space; and generating decoded hard information data of a first failing codeword of the select page by decoding the first failing codeword using the stripe vector as last updated and using both stored undecoded hard information data and stored soft information data of the first failing codeword retrieved from the first data buffer space.

In Example 2, the subject matter of Example 1 includes, wherein the read error handling process comprises: after the generating of the decoded hard information data of the first failing codeword, causing at least the decoded hard information data to be sent to a host system.

In Example 3, the subject matter of Examples 1-2 includes, wherein the read error handling process comprises: after the generating of the decoded hard information data of the first failing codeword, updating the stripe vector based on the stripe vector as last updated, the stored undecoded hard information data of the first failing codeword retrieved from the first data buffer space, and the decoded hard information data of the first failing codeword.

In Example 4, the subject matter of Example 3 includes, wherein the read error handling process comprises: after the updating of the stripe vector based on the stored undecoded hard information data of the first failing codeword and the decoded hard information data of the first failing codeword, generating decoded hard information data of a second failing codeword by decoding the second failing codeword of the select page using the stripe vector as last updated and using both stored undecoded hard information data and stored soft information data of the second failing codeword retrieved from the first data buffer space.

In Example 5, the subject matter of Example 4 includes, wherein the read error handling process comprises: after the generating of the decoded hard information data of a second failing codeword, updating the stripe vector based on the stripe vector as last updated, the stored undecoded hard information data of the second failing codeword retrieved from the first data buffer space, and the decoded hard information data of the second failing codeword.

In Example 6, the subject matter of Example 5 includes, wherein the operations comprise: after performing the read error handling process, causing at least the decoded hard information data of the first failing codeword and the decoded hard information data of the second failing codeword to be sent to a host system.

In Example 7, the subject matter of Examples 1-6 includes, wherein the operations comprise: causing a first page-level read operation to be performed on a select page of the memory device; and monitoring for a failure to read the select page by the page-level read operation, the read error handling process being performed on the select page in response to a failure to read the select page by the page-level read operation.

In Example 8, the subject matter of Examples 1-7 includes, wherein the undecoded hard information data and the soft information data for the first failing codeword comprises one-hard-two-soft (1H2S) information data.

In Example 9, the subject matter of Examples 1-8 includes, wherein the read error handling process comprises: causing allocation of the first data buffer space on the system, the first data buffer space having sufficient space to store undecoded hard information data and soft information data of all codewords of the select page.

In Example 10, the subject matter of Examples 1-9 includes, wherein the read error handling process comprises: causing allocation of the second data buffer space on the system, the second data buffer space being separate from the first data buffer space, the second data buffer space having sufficient space to store undecoded hard information data and soft information data of all codewords of at least a single page of the stripe.

In Example 11, the subject matter of Examples 1-10 includes, wherein the individual page is a first individual page, wherein the read error handling process comprises: after the stripe vector is updated for the first individual page, for a second individual page of the stripe different from the select page: causing the page-level read operation to be performed on the second individual page; storing, in the second data buffer space of the system, undecoded hard information data and soft information data of one or more codewords of the second individual page, the storing causing replacement of any undecoded hard information data and soft information data of a prior page; and updating the stripe vector based on decoded hard information data of one or more passing codewords of the second individual page and based on stored undecoded hard information data of one or more failing codewords of the second individual page retrieved from the second data buffer space; and wherein the generating of the decoded hard information data of the first failing codeword is performed after the stripe vector is updated for the second individual page of the stripe.

In Example 12, the subject matter of Examples 1-11 includes, wherein the individual page is a first individual page, wherein the read error handling process comprises: after the stripe vector is updated for the first individual page, for a second individual page of the stripe different from the select page: causing the page-level read operation to be performed on the second individual page; causing allocation of additional data buffer space on the system for the second individual page; storing, in the additional data buffer space accolated for the second individual page, undecoded hard information data and soft information data of one or more codewords of the second individual page; and updating the stripe vector based on decoded hard information data of one or more passing codewords of the second individual page and based on stored undecoded hard information data of one or more failing codewords of the second individual page retrieved from the additional data buffer space accolated for the second individual page; and wherein the generating of the decoded hard information data of the first failing codeword is performed after the stripe vector is updated for the second individual page of the stripe.

In Example 13, the subject matter of Examples 1-12 includes, wherein the decoding of the first failing codeword using the stripe vector as last updated and using both the stored undecoded hard information data the stored soft information data of the first failing codeword retrieved from the first data buffer space comprises: using a low-density parity-check (LDPC) decode process to decode the first failing codeword, the LDPC decode process receiving the stored undecoded hard information data of the first failing codeword as hard information-input data, the LDPC decode process receiving both the stored soft information data of the first failing codeword and the stripe vector as last updated as soft information-input data.

In Example 14, the subject matter of Examples 1-13 includes, wherein the performing of the page-level read operation on the individual page comprises: performing one or more of a predefined set of page-level read error handling stages on the individual page in response to detecting an error in reading the individual page during the page-level read operation.

Example 15 is at least one machine-readable medium including instructions that, when executed by a processing device of a memory sub-system, cause the processing device to perform operations to implement of any of Examples 1-14.

Example 16 is a method to implement of any of Examples 1-14.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (e.g., non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, configured to perform operations, the operations comprising performing a read error handling process on a select page of the memory device, the select page being part of a plurality of pages of the memory device that forms a stripe, the read error handling process comprising:
      storing, in a first data buffer space of the system, undecoded hard information data and soft information data of at least one failing codeword of the select page;
      generating a stripe vector for the stripe based on decoded hard information data of one or more passing codewords of the select page and based on the undecoded hard information data of one or more failing codewords of the select page;
      for an individual page of the stripe different from the select page:
         causing a page-level read operation to be performed on the individual page;
         storing, in a second data buffer space of the system, undecoded hard information data of one or more codewords of the individual page; and
         updating the stripe vector based on decoded hard information data of one or more passing codewords of the individual page and based on stored undecoded hard information data of one or more failing codewords of the individual page retrieved from the second data buffer space; and
      generating decoded hard information data of a first failing codeword of the select page by decoding the first failing codeword using the stripe vector as last updated and using both stored undecoded hard information data and stored soft information data of the first failing codeword retrieved from the first data buffer space.

2. The system of claim 1, wherein the read error handling process comprises:
   after the generating of the decoded hard information data of the first failing codeword, causing at least the decoded hard information data to be sent to a host system.

3. The system of claim 1, wherein the read error handling process comprises:
   after the generating of the decoded hard information data of the first failing codeword, updating the stripe vector based on the stripe vector as last updated, the stored undecoded hard information data of the first failing codeword retrieved from the first data buffer space, and the decoded hard information data of the first failing codeword.

4. The system of claim 3, wherein the read error handling process comprises:
   after the updating of the stripe vector based on the stored undecoded hard information data of the first failing codeword and the decoded hard information data of the first failing codeword, generating decoded hard information data of a second failing codeword by decoding the second failing codeword of the select page using the stripe vector as last updated and using both stored undecoded hard information data and stored soft information data of the second failing codeword retrieved from the first data buffer space.

5. The system of claim 4, wherein the read error handling process comprises:
   after the generating of the decoded hard information data of a second failing codeword, updating the stripe vector based on the stripe vector as last updated, the stored undecoded hard information data of the second failing codeword retrieved from the first data buffer space, and the decoded hard information data of the second failing codeword.

6. The system of claim 5, wherein the operations comprise:
   after performing the read error handling process, causing at least the decoded hard information data of the first failing codeword and the decoded hard information data of the second failing codeword to be sent to a host system.

7. The system of claim 1, wherein the operations comprise:
   causing a first page-level read operation to be performed on a select page of the memory device; and
   monitoring for a failure to read the select page by the page-level read operation, the read error handling process being performed on the select page in response to a failure to read the select page by the page-level read operation.

8. The system of claim 1, wherein the undecoded hard information data and the soft information data for the first failing codeword comprises one-hard-two-soft (1H2S) information data.

9. The system of claim 1, wherein the read error handling process comprises:

causing allocation of the first data buffer space on the system, the first data buffer space having sufficient space to store undecoded hard information data and soft information data of all codewords of the select page.

10. The system of claim 1, wherein the read error handling process comprises:

causing allocation of the second data buffer space on the system, the second data buffer space being separate from the first data buffer space, the second data buffer space having sufficient space to store undecoded hard information data and soft information data of all codewords of at least a single page of the stripe.

11. The system of claim 1, wherein the individual page is a first individual page, wherein the read error handling process comprises:

after the stripe vector is updated for the first individual page, for a second individual page of the stripe different from the select page:

causing the page-level read operation to be performed on the second individual page;

storing, in the second data buffer space of the system, undecoded hard information data and soft information data of one or more codewords of the second individual page, the storing causing replacement of any undecoded hard information data and soft information data of a prior page; and updating the stripe vector based on decoded hard information data of one or more passing codewords of the second individual page and based on stored undecoded hard information data of one or more failing codewords of the second individual page retrieved from the second data buffer space; and wherein the generating of the decoded hard information data of the first failing codeword is performed after the stripe vector is updated for the second individual page of the stripe.

12. The system of claim 1, wherein the individual page is a first individual page, wherein the read error handling process comprises:

after the stripe vector is updated for the first individual page, for a second individual page of the stripe different from the select page:

causing the page-level read operation to be performed on the second individual page;

causing allocation of additional data buffer space on the system for the second individual page;

storing, in the additional data buffer space accolated for the second individual page, undecoded hard information data and soft information data of one or more codewords of the second individual page; and updating the stripe vector based on decoded hard information data of one or more passing codewords of the second individual page and based on stored undecoded hard information data of one or more failing codewords of the second individual page retrieved from the additional data buffer space accolated for the second individual page; and wherein the generating of the decoded hard information data of the first failing codeword is performed after the stripe vector is updated for the second individual page of the stripe.

13. The system of claim 1, wherein the decoding of the first failing codeword using the stripe vector as last updated and using both the stored undecoded hard information data the stored soft information data of the first failing codeword retrieved from the first data buffer space comprises:

using a low-density parity-check (LDPC) decode process to decode the first failing codeword, the LDPC decode process receiving the stored undecoded hard information data of the first failing codeword as hard information-input data, the LDPC decode process receiving both the stored soft information data of the first failing codeword and the stripe vector as last updated as soft information-input data.

14. The system of claim 1, wherein the performing of the page-level read operation on the individual page comprises:

performing one or more of a predefined set of page-level read error handling stages on the individual page in response to detecting an error in reading the individual page during the page-level read operation.

15. At least one non-transitory machine-readable storage medium comprising instructions that, when executed by a processing device of a memory sub-system, cause the processing device to perform operations comprising:

storing, in a first data buffer space of the memory sub-system, undecoded hard information data and soft information data of at least one failing codeword of a select page of a memory device of the memory sub-system, the select page being part of a plurality of pages of the memory device that forms a stripe;

generating a stripe vector for the stripe based on decoded hard information data of one or more passing codewords of the select page and based on the undecoded hard information data of one or more failing codewords of the select page;

for an individual page of the stripe different from the select page:

causing a page-level read operation to be performed on the individual page;

storing, in a second data buffer space of the memory sub-system, undecoded hard information data and soft information data of one or more codewords of the individual page; and updating the stripe vector based on decoded hard information data of one or more passing codewords of the individual page and based on stored undecoded hard information data of one or more failing codewords of the individual page retrieved from the second data buffer space; and generating decoded hard information data of a first failing codeword of the select page by decoding the first failing codeword using the stripe vector as last updated and using both stored undecoded hard information data and stored soft information data of the first failing codeword retrieved from the first data buffer space.

16. The at least one non-transitory machine-readable storage medium of claim 15, wherein the operations comprise:

after the generating of the decoded hard information data of the first failing codeword, causing at least the decoded hard information data to be sent to a host system.

17. The at least one non-transitory machine-readable storage medium of claim 15, wherein the operations comprise:

after the generating of the decoded hard information data of the first failing codeword, updating the stripe vector based on the stripe vector as last updated, the stored undecoded hard information data of the first failing codeword retrieved from the first data buffer space, and the decoded hard information data of the first failing codeword.

18. The at least one non-transitory machine-readable storage medium of claim 17, wherein the operations comprise:

after the updating of the stripe vector based on the stored undecoded hard information data of the first failing codeword and the decoded hard information data of the first failing codeword, generating decoded hard information data of a second failing codeword by decoding the second failing codeword of the select page using the stripe vector as last updated and using both stored undecoded hard information data and stored soft information data of the second failing codeword retrieved from the first data buffer space.

19. The at least one non-transitory machine-readable storage medium of claim 18, wherein the operations comprise:

after the generating of the decoded hard information data of a second failing codeword, updating the stripe vector based on the stripe vector as last updated, the stored undecoded hard information data of the second failing codeword retrieved from the first data buffer space, and the decoded hard information data of the second failing codeword.

20. A method comprising:

storing, in a first data buffer space of a memory sub-system, undecoded hard information data and soft information data of at least one failing codeword of a select page of a memory device of the memory sub-system, the select page being part of a plurality of pages of the memory device that forms a stripe;

generating a stripe vector for the stripe based on decoded hard information data of one or more passing codewords of the select page and based on the undecoded hard information data of one or more failing codewords of the select page;

for an individual page of the stripe different from the select page:

causing a page-level read operation to be performed on the individual page;

storing, in a second data buffer space of the memory sub-system, undecoded hard information data of one or more codewords of the individual page; and updating the stripe vector based on decoded hard information data of one or more passing codewords of the individual page and based on stored undecoded hard information data of one or more failing codewords of the individual page retrieved from the second data buffer space; and generating decoded hard information data of a first failing codeword of the select page by decoding the first failing codeword using the stripe vector as last updated and using both stored undecoded hard information data and stored soft information data of the first failing codeword retrieved from the first data buffer space.

* * * * *